(12) United States Patent
Yamazaki et al.

(10) Patent No.: US 7,329,985 B2
(45) Date of Patent: *Feb. 12, 2008

(54) SEMICONDUCTOR DEVICE AND MANUFACTURING METHOD THEREOF

(75) Inventors: Shunpei Yamazaki, Tokyo (JP); Yuugo Goto, Kanagawa (JP); Yoshifumi Tanada, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/479,802

(22) Filed: Jun. 30, 2006

(65) Prior Publication Data

US 2006/0250073 A1    Nov. 9, 2006

Related U.S. Application Data

(63) Continuation of application No. 10/636,869, filed on Aug. 7, 2003, now Pat. No. 7,081,704.

(30) Foreign Application Priority Data

Aug. 9, 2002    (JP) .............................. 2002-233953

(51) Int. Cl.
    *H05B 33/12*    (2006.01)
(52) U.S. Cl. ...................................... 313/506; 313/509
(58) Field of Classification Search ........ 313/498–512; 345/45, 46, 47, 36, 76; 315/169.3
See application file for complete search history.

(56) References Cited

U.S. PATENT DOCUMENTS

| 4,470,667 | A |   | 9/1984  | Okubo et al. |
| 5,239,228 | A | * | 8/1993  | Taniguchi et al. ......... 313/512 |
| 5,680,187 | A |   | 10/1997 | Nagayama et al. |

(Continued)

FOREIGN PATENT DOCUMENTS

EP    1 085 576 A2    3/2001

(Continued)

OTHER PUBLICATIONS

Sakurai, Y., "Development of a Color Filter for LCDs Based on Polyimide Materials," IDW '99, 1999, pp. 363-366.

(Continued)

*Primary Examiner*—Nimeshkumar D. Patel
*Assistant Examiner*—Christopher M. Raabe
(74) *Attorney, Agent, or Firm*—Cook, Alex, McFarron, Manzo, Cummings & Mehler, Ltd.

(57) ABSTRACT

A self-light emitting display device with top-emission usually has no film that is capable of light shielding. Therefore, it is necessary to form a light-shielding layer additionally with, which leads the number of processes to increase.

In the present invention, plural films selected from a first coloring layer 161, a second coloring layer 162, and a third coloring layer 163 formed on an opposing substrate are laminated to form a light-shielding portion without using a light-shielding mask.

38 Claims, 11 Drawing Sheets

400: substrate
401: opposing electrode
402: driving TFT
403: interlayer insulating film
404: wiring
405: 1st barrier layer
406: 1st coloring layer
407: 2nd coloring layer
408: 3rd coloring layer
409: 2nd barrier layer
410: pixel electrode (transparent electrode)
411: bank
412: EL layer
413: opposing electrode (reflective electrode)

U.S. PATENT DOCUMENTS

| | | |
|---|---|---|
| 5,757,451 A | 5/1998 | Miyazaki et al. |
| 6,436,815 B1 | 8/2002 | Yamazaki et al. |
| 6,445,005 B1 | 9/2002 | Yamazaki et al. |
| 6,650,480 B2 | 11/2003 | Tanaka |
| 6,671,025 B1 | 12/2003 | Ikeda et al. |
| 6,690,438 B2 | 2/2004 | Sekiguchi |
| 6,706,544 B2 | 3/2004 | Yamazaki et al. |
| 6,894,312 B2 | 5/2005 | Yamazaki et al. |
| 7,081,704 B2 * | 7/2006 | Yamazaki et al. .......... 313/500 |
| 2001/0040655 A1 | 11/2001 | Yamazaki et al. |
| 2002/0017645 A1 | 2/2002 | Yamazaki et al. |
| 2002/0056374 A1 | 5/2002 | Keefer et al. |
| 2002/0094613 A1 | 7/2002 | Yamazaki et al. |
| 2002/0125817 A1 | 9/2002 | Yamazaki et al. |
| 2002/0125831 A1 | 9/2002 | Inukai et al. |
| 2003/0107314 A1 * | 6/2003 | Urabe et al. ................ 313/506 |
| 2003/0174106 A1 | 9/2003 | Tanada et al. |
| 2005/0041002 A1 | 2/2005 | Takahara et al. |
| 2005/0162092 A1 | 7/2005 | Yamazaki et al. |

FOREIGN PATENT DOCUMENTS

| | | |
|---|---|---|
| EP | 1 227 467 A2 | 7/2002 |
| JP | 2-287303 | 11/1990 |
| JP | 8-328000 | 12/1996 |
| JP | 10-073813 | 3/1998 |
| JP | 10-197712 | 7/1998 |
| JP | 2002-023148 | 1/2002 |
| JP | 2002-304155 | 10/2002 |

OTHER PUBLICATIONS

Yoshino, H. et al, "Development of a New Color Set of Transfer-Type Color Filter Materials for LCDs" IDW '99, 1999, pp. 367-370.

* cited by examiner

Light Emitting Region →
200: substrate
201: pixel electrode (transparent electrode)
202: EL layer
203: opposing electrode (reflective electrode)
204: light-shielding layer (material of gate electrode)

Light Emitting Region →
250: substrate
251: pixel electrode (reflective electrode)
252: EL layer
253: opposing electrode (transparent electrode)
254: light-shielding layer

Fig.4A

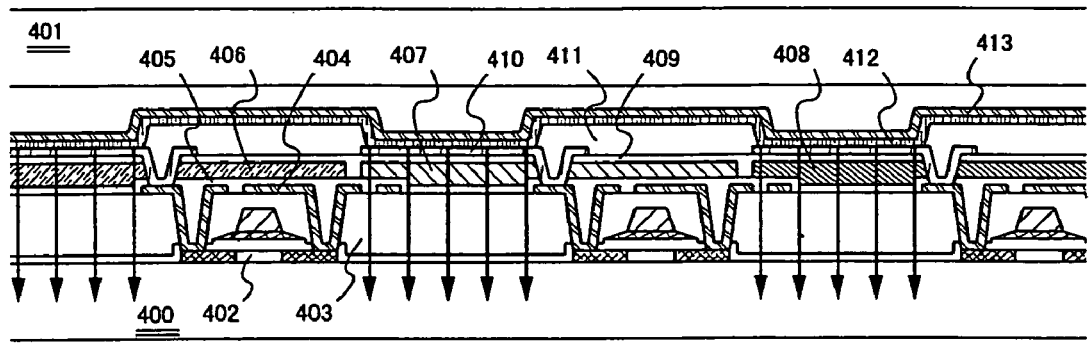

400: substrate
401: opposing electrode
402: driving TFT
403: interlayer insulating film
404: wiring
405: 1st barrier layer
406: 1st coloring layer
407: 2nd coloring layer
408: 3rd coloring layer
409: 2nd barrier layer
410: pixel electrode (transparent electrode)
411: bank
412: EL layer
413: opposing electrode (reflective electrode)

Fig.4B

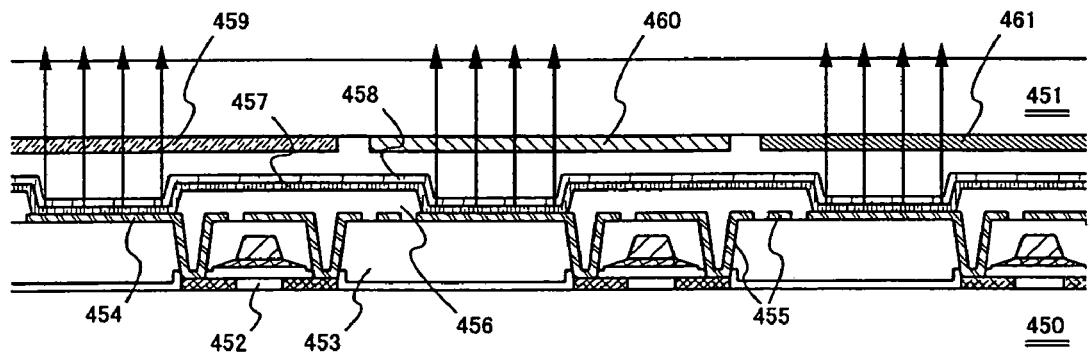

450: substrate
451: opposing electrode
452: driving TFT
453: interlayer insulating film
454: pixel electrode (reflective electrode)
455: wiring
456: bank
457: EL layer
458: opposing electrode (transparent electrode)
459: 1st coloring layer
460: 2nd coloring layer
461: 3rd coloring layer

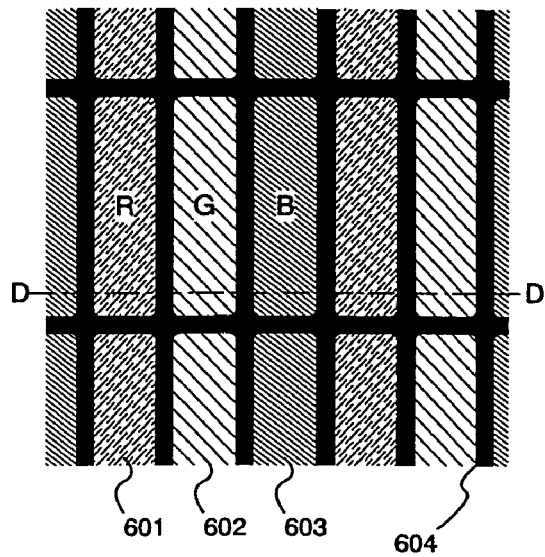
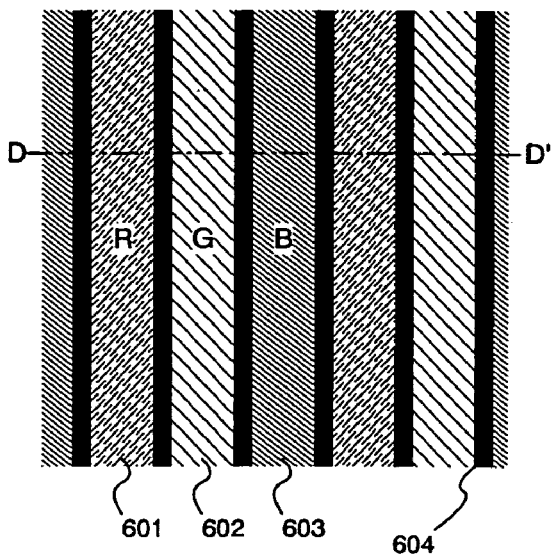
Fig.6A  Fig.6B
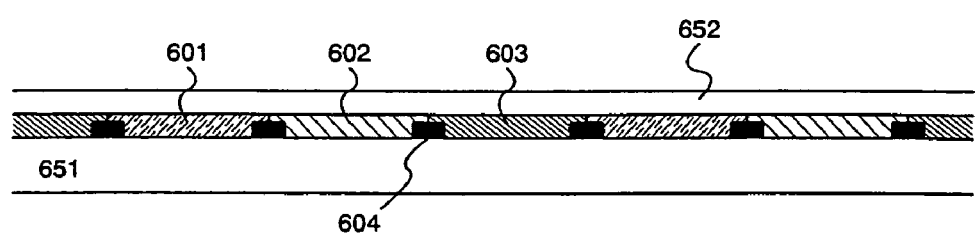
Fig.6C p-channel TFT    n-channel TFT    n-channel TFT    p-channel TFT
◄──── Driving Circuit Portion ────►◄──── Pixel Portion ────►

SEMICONDUCTOR DEVICE AND MANUFACTURING METHOD THEREOF

This application is a continuation of copending U.S. application Ser. No. 10/636,869, filed on Aug. 7, 2003 now U.S. Pat. No. 7,081,704.

BACKGROUND OF THE INVENTION

1. Field of the Invention

The present invention relates to a semiconductor device that has a circuit including a thin film transistor (Hereinafter, TFI) and a method of manufacturing the semiconductor device.

The semiconductor device indicates general devices that are able to function with utilizing characteristics of semiconductor, and includes all of a liquid crystal display device, a display device (an EL display device) which has a self-light emitting element represented by an electroluminescent (Hereinafter, EL) element, a semiconductor circuit, and an electronic apparatus using those as parts.

2. Description of the Related Art

Recently, attention has been paid to techniques of manufacturing a TFT with using a thin semiconductor film (a thickness on the order of several to several hundreds nm) formed on an insulating surface of a substrate. It is expected that the TFT be widely applied to electronic devices, and rapid development is required for a switching element for driving a liquid crystal display device or an EL display device.

In a display device, attention is paid to an active matrix display device in which, in order to obtain an image with a high quality, pixel electrodes are arrange in a matrix shape and a switching element connected to each of the pixel electrodes is driven to perform displaying. Above all, an EL display device that has a pixel using an EL element that is a self-light emitting element is expected as a display device in the next generation, instead of a liquid crystal display device.

An EL element has an EL layer formed to be sandwiched between first and second electrodes, and electric current generated between the first and second electrodes to obtain emission of light for performing display of an image. There are given advantages that the device is lighter, thinner and more miniaturized since a backlight as used in a liquid crystal display device is unnecessary, a view angle is wide, and smooth display of an animation is obtained due to a quick response speed.

As a means for realizing a color display in an EL display device, there may be given a means in which an EL material for emitting light of each of red (R), green (G), blue (B) is used to form each light emitting portion, or a means in which an EL element for emitting light of a single color such as white or blue is used and emitted light is made to pass through a color filter or a color conversion layer for obtaining emission of light of each of RGB.

A color filter generally used for a display device has coloring layers 601 to 603 respectively corresponding to R, G, and B and a light-shielding layer 604 as shown in FIGS. 6A to 6C, and absorbs a part of light irradiated to the coloring layers and transmits the other part of the light to extract light of R, G, and B. The light-shielding layer 604 is generally formed of a film such as a metal (such as chromium) film or an organic film containing a black pigment, and may be provided right between adjacent pixels as shown in FIG. 6A or in a stripe-shape as shown in FIG. 6B. In the case that pixels is arranged in a delta arrangement, another means may be employed.

FIG. 6C shows a section along D-D' in FIG. 6A or 6B. After the light-shielding layer 604 and the coloring layers 601 to 603 are formed on a substrate 651, a planarization film 652 may be provided in order to perform planarization of the surface. In addition, it is possible to use the planarization film 652 as a barrier layer against an impurity included in the coloring layers 601 to 603.

It is noted on a takeout direction of light emitted from an EL element that there is bottom-emission called in the case of taking out of a side of a substrate that has a TFT formed as shown in FIG. 4A while there is top-emission called in the case of taking out of a side of an opposing substrate as shown in FIG. 4B In the case of forming a color filter, a position for forming is different in accordance with the takeout direction of emitted light. In the case of the bottom-emission, as shown in FIG. 4A, it is necessary that coloring layers be provided near a TFT substrate 400 rather than a pixel electrode 410 to form a color filter. That is, processes proceed in order of forming a TFT 402, forming a wiring 404, forming coloring layers 406 to 408, forming the pixel electrode 410, forming an EL layer 412, forming an opposing electrode 413, and sealing with an opposing substrate 401. In the case of the top-emission, as shown in FIG. 4B, coloring layers 459 to 461 are provided at a side of an opposing substrate 451 to form a color filter since the emitted light is obtained from a side of an opposing electrode 458. That is, the process for forming the color filter is independent of ones for a TFT substrate 450.

When a color filter is formed at the side of the TFT substrate like the case of the bottom-emission, there are problems that it is impossible that coloring layers themselves withstand a temperature of heat treatment in a later process and impurities in the coloring layers diffuse due to heat to have a TFT contaminated. Therefore, it is necessary to provide barrier layers 405 and 409, represented by a film such as a silicon nitride film, above and below the portion in which the coloring layers are formed. In the case of the top-emission, on the other hand, it is suitable that there is no necessary of worrying about the above-mentioned problems since it is possible to form a color filter independently of processes for the TFT substrate.

SUMMARY OF THE INVENTION

In an EL display device, dummy pixels are often provided at an outer edge of a displaying area to ensure a margin in order to avoid an edge portion of an EL layer from covering the displaying area in forming the EL layer.

As described in Japanese Patent Application No. 2001-19651 (Japanese Patent Laid-Open 2002-304155), there is a method in which current monitoring pixels are provided outside a displaying area to perform correction of variation in luminance in the displaying area. The pending U.S. patent application Ser. No. 10/060,709 filed on Jan. 29, 2002 corresponds to Japanese Patent Application No. 2001-19651. Also, this U.S. Patent Application is published as Publication No. 2002/0125831 A1. An entire disclosure of this U.S. Patent Application is incorporated herein by reference. In such case, there is a case in which a part of the above-mentioned dummy pixels are used as the current monitoring pixels.

Since no light should be emitted originally from such dummy pixels and current monitoring pixels, it is necessary that a light-shielding layer be formed to prevent light leakage from occurring. In the case of an EL element with bottom-emission, there are many portions formed of opaque materials such as a wiring and a gate electrode in a path of emitted light from an EL layer 202 till recognition by eye, as shown in FIG. 2A. Therefore it is possible to reduce a mask for forming a light-shielding layer 204 in forming a color filter if the light-shielding layer 204 is formed with utilizing those materials.

On the other hand, in the case of top-emission, an EL element has no portion formed of opaque materials in a path of emitted light from an EL layer 252 till recognition by eye, as shown in FIG. 2B. Since a light-shielding layer needs to be formed additionally, it is concerned to increase processes, lower yield, and the like.

The present invention has been accomplished in view of the above problem. It is an object of the present invention to form a light-shielding layer with high precision without increasing the number of masks and provide a display device that can obtain a high-definition display.

In general, visible light indicates light that has wavelengths of 400 to 780 nm. A coloring layer used for a color filter transmits, of this visible light, only light that has a specific range of wavelengths to provide coloring light, and coloring layers for different colors naturally have a characteristic of transmitting light with a different range of wavelengths from each other.

In other words, light with a wavelength that has a high transmissivity with respect to a coloring layer is hardly transmitted through a different coloring layer at all. In the present invention, with a focus on this point, two or three coloring layers are laminated for a portion to be shielded from light to provide a layer that is able to shield against all visible light, which is to be a light-shielding layer. Since it is unnecessary to form a light-shielding layer additionally, the reduction of the process makes it possible to realize lowering a manufacturing cost and improving yield.

Configurations of the present invention will be described below.

A semiconductor device according to the present invention has a plurality of different first to third coloring layers and a light-shielding portion, wherein the light-shielding portion includes a laminate of plural layers selected form the plurality of different first to third coloring layers.

Another semiconductor device according to the present invention has a source signal line, a gate signal line, a TFT, a plurality of different first to third coloring layers, and a light-shielding portion, wherein the light-shielding portion is formed to overlap at least a portion in which the source signal line, the gate signal line, and the TFT are formed.

Further, another semiconductor device according to the present invention has a plurality of pixel electrodes, a plurality of different first to third coloring layers, and a light-shielding portion including a laminate of plural layers selected form the plurality of different first to third coloring layers, wherein the light-shielding portion is formed to overlap with a portion between any pixel electrode and an adjacent pixel electrode to the pixel electrode.

The present invention has a feature that the first coloring layer is provided for red, the second coloring layer is provided for green, and the third coloring layer is provided for blue.

The present invention has another feature that the plurality of different first to third coloring layers and the light-shielding portion are both formed on an opposing substrate.

The present invention has also another feature that the semiconductor device is a display device using a self-light emitting element.

BRIEF DESCRIPTION OF THE DRAWINGS

In the accompanying drawings:

FIGS. 4A and 4B are diagrams showing sectional structures of substrates of EL display devices with top-emission and bottom-emission, respectively;

FIGS. 6A to 6C are diagrams showing configurations of typical coloring layers;

DETAILED DESCRIPTION OF THE PREFERRED EMBODIMENTS

Embodiment Mode

Figure 1A:
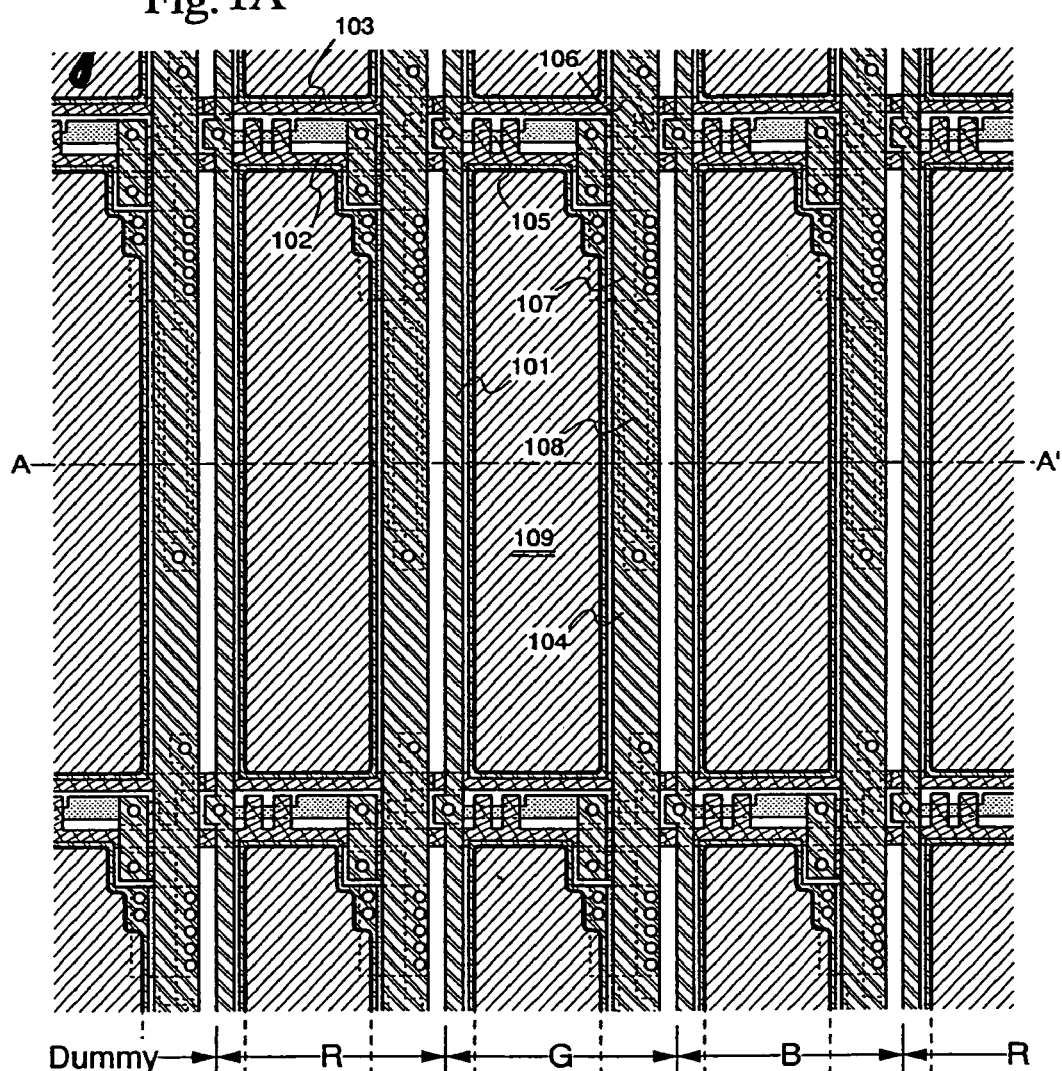
FIGS. 1A and 1B are diagrams showing a laminated structure of coloring layers in Embodiment Mode.
Figure 1B:
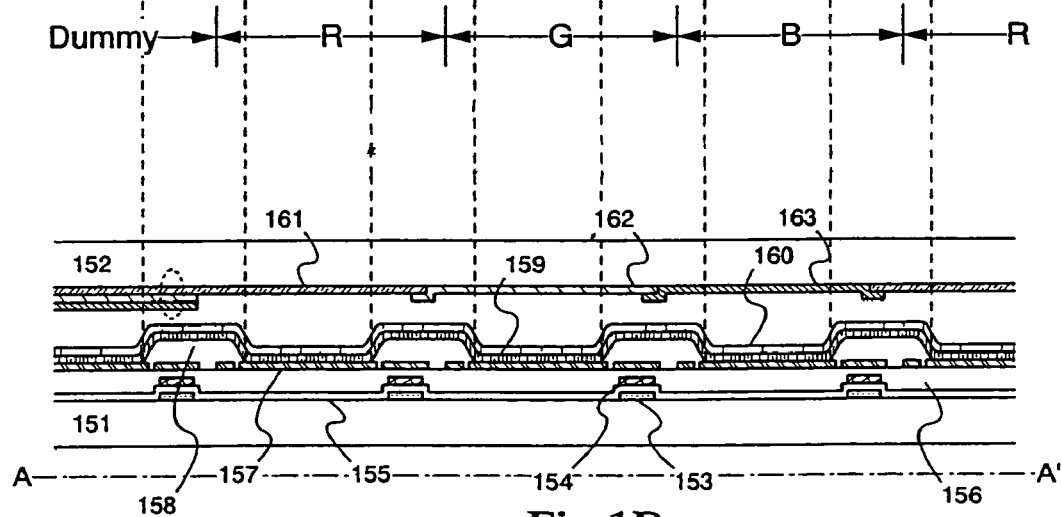
Figure 2A:
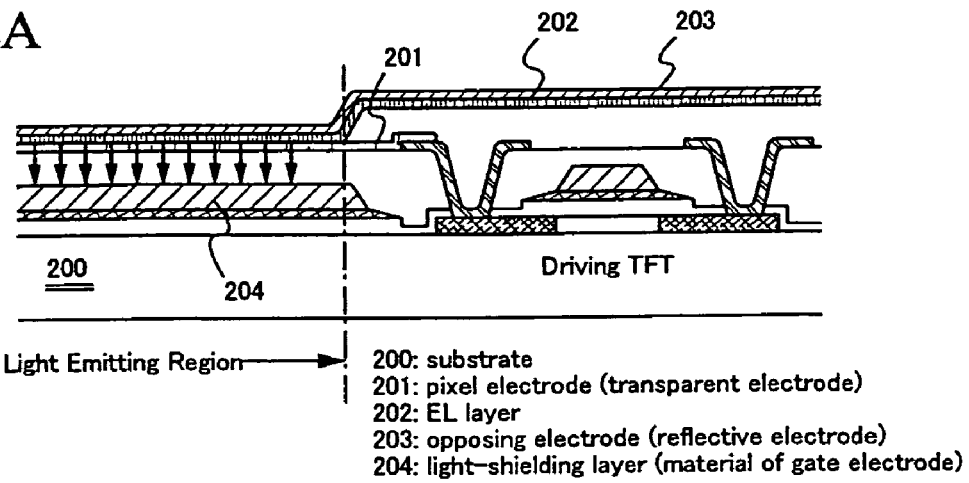
FIGS. 2A and 2B are diagrams exemplifying means for forming light-shielding layers in the cases of top-emission and bottom-emission, respectively.
Figure 2B:
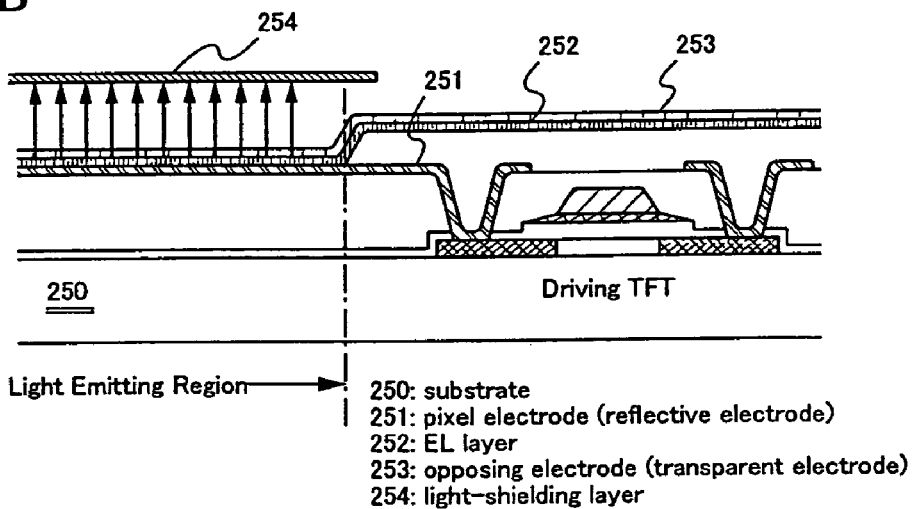

FIGS. 1A and 1B show an embodiment mode of the present invention. Shown in FIG. 1A is a pixel portion of an EL display device, which has pixels arranged in a matrix shape. Each of the pixels has a source signal line 101, a first gate signal line 102, a second gate signal line 103, an electric current supplying line 104, a switching TFT 105, an erasing TFT 106, a driving TFT 107, a capacitor 108, and a pixel electrode 109. The capacitor 108 may not be provided particularly providing that it is possible to keep voltage between a gate and a source of the driving TFT 107 normally during a predetermined display period.

FIG. 1B shows a section along A-A' in FIG. 1A. In forming TFTs on a substrate 151, a first electrode 153 of the capacitor is formed at the same time when active layers of the TFTs are formed and a second electrode 154 of the capacitor is formed at the same time when gate electrodes of the TFTs are formed to form a capacitor through a gate insulating film 155. In addition, wirings and pixel electrodes 157 are formed through an interlayer insulating film 156, and an insulating layer is formed of a suitable material for planarization such as resin and an opening is formed at a portion to be a light emitting potion to form banks 158. After that, an EL layer 159 and an opposing electrode 160 are formed. Since the EL display device shown here has a type of top-emission, it is preferable that a material with a high reflectivity is used for the pixel electrodes 157 and a material with a high transmissivity is used for the opposing electrode 160.

On the other hand, first to third coloring layers 161 to 163 are sequentially formed on an opposing substrate 152 to be a color filter. In regions (denoted as 'Dummy' in FIG. 1A) from which emitted light is not take out, such as a dummy pixel and a current monitoring pixel, two or three of the first to third coloring layers are laminated to be a light-shielding layer. Furthermore, not shown in the figure, a protective film may be formed on the coloring layers in order to perform planarization and prevent diffusion of impurities in the coloring layers.

Figure 7:
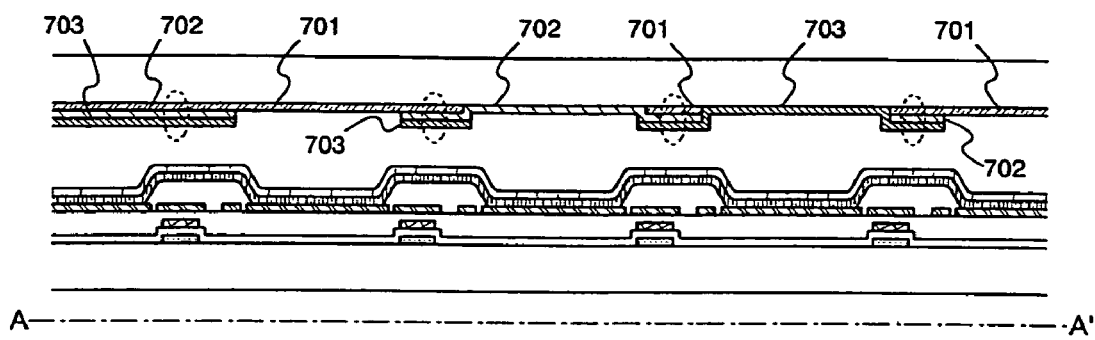
FIG. 7 is a diagram showing a laminated structure of coloring layers in a light-shielding portion.

With respect to a light-shielding layer between adjacent pixels, three of coloring layers may be laminated as shown by a dotted circles in FIG. 7 although two of adjacent coloring layers are laminated in FIG. 1B.

Figure 3A:
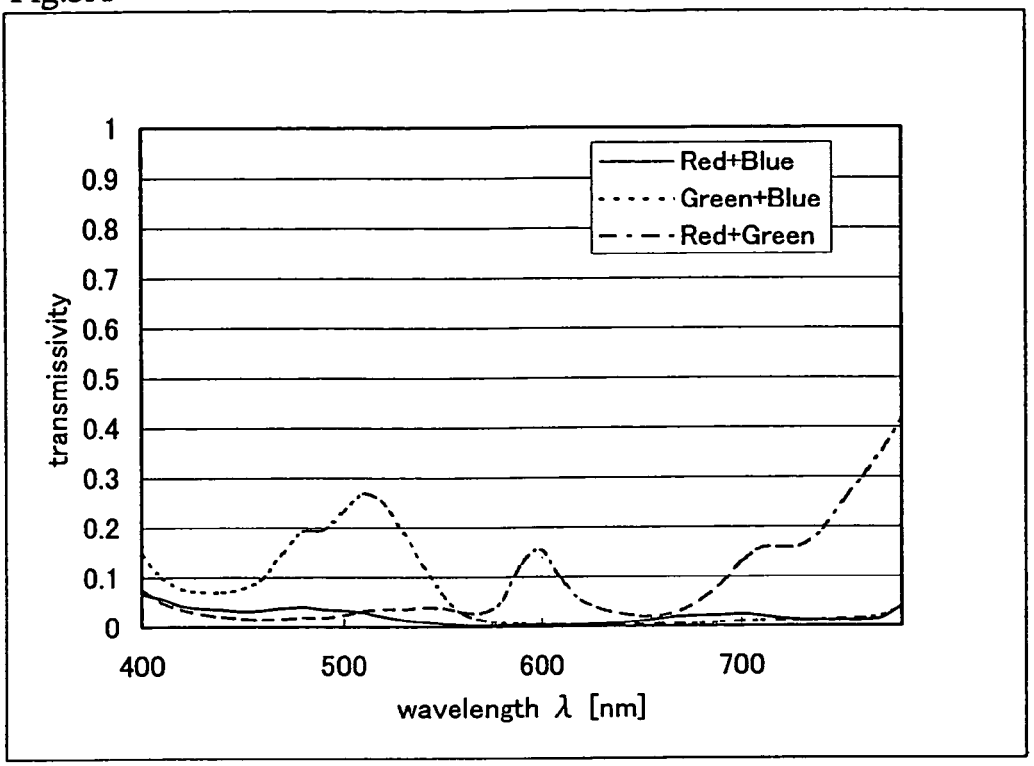
FIGS. 3A and 3B are graphs showing measurement result of transmissivity for single, two-layer, and three-layer laminated structures.

FIG. 3A shows measurement result of transmissivity for each of two-layer laminate films of coloring layers for red and blue, coloring layers for blue and green, and coloring layers for red and green. The transmissivity of the two-layer laminate film is nearly equal to a product of transmissivity of each coloring layer. Although the two-layer laminate film of the coloring layers for red and blue has a largely good light-shielding characteristic that the transmissivity is on the order of 7% or less with respect to all wavelengths, several tens percents of light with certain wavelength is transmitted in the case of the two-layer laminate films of the coloring layers for blue and green and the coloring layers for red and green.

Figure 3B:
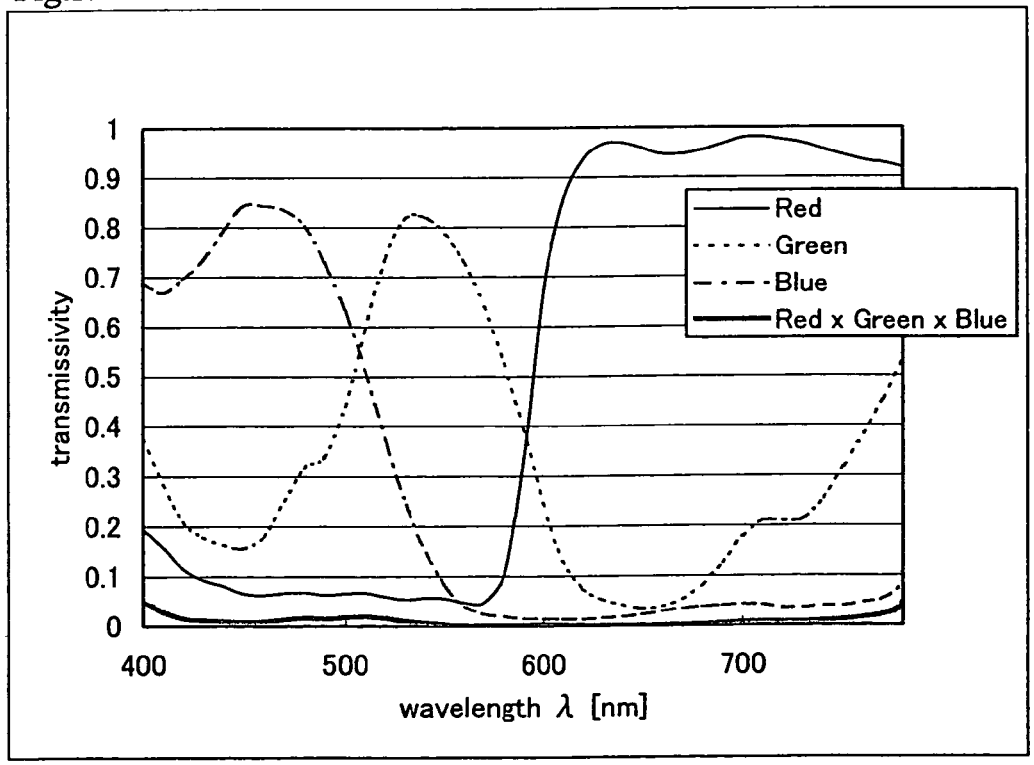

Further, FIG. 3B shows measurement result of transmissivity of each of coloring layers for red, green, and blue and calculation result of a product of the transmissivities as the case of a three-layer laminate film. It makes transmissivity on the order of less than 4% with respect to all wavelengths to be the three-layer laminate film, and therefore it can be said that the three-layer laminate film is enough to function as a light-shielding layer.

In the case of an EL display device and the like, a light-shielding layer of a two-layer laminate film has possibilities of realizing only insufficient light-shielding since intensity of emitted light is large. Accordingly, it is desirable to be a light-shielding layer using a three-layer laminate film, as shown in FIG. 7, which is also applied to a transmissive liquid crystal display device and the like. On the other hand, in the case of a reflective liquid crystal display device and the like, intensity of light is not so large since natural light is used. In such case, a two-layer laminate film (a two-layer laminate film of coloring layers for red and blue or a two-layer laminate film of coloring layers for green and blue, which has a relatively good light-shielding characteristic, is desirable) may be used for a light-shielding layer.

There is a description given here as an example on a display device that corresponds to a general color display and has coloring layers for red, green, and blue. It is needless to say that a similar means can be applied to a display device that has coloring layers for two different colors or more than four colors to be capable of multi-color display.

EMBODIMENTS

Embodiment 1

An embodiment of the present invention will be described below with taking as an example fabrication of an opposing substrate used for an EL display device with top-emission.

Figure 8A:
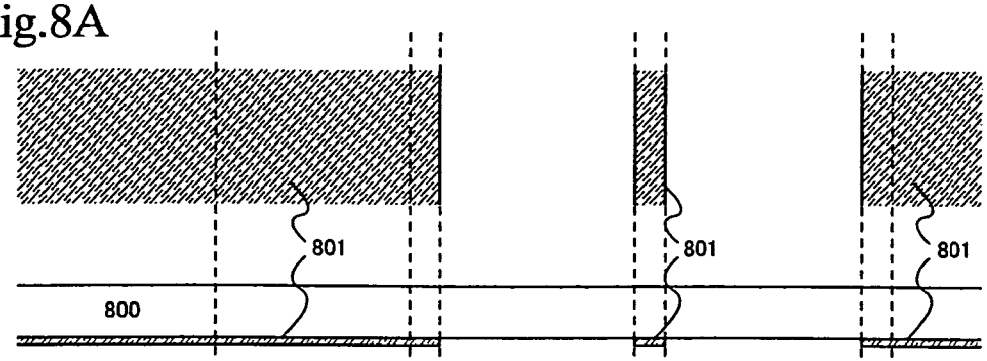
FIGS. 8A to 8C are diagrams showing processes for laminating coloring layers to form light-shielding layers at the same time.
Figure 8B:
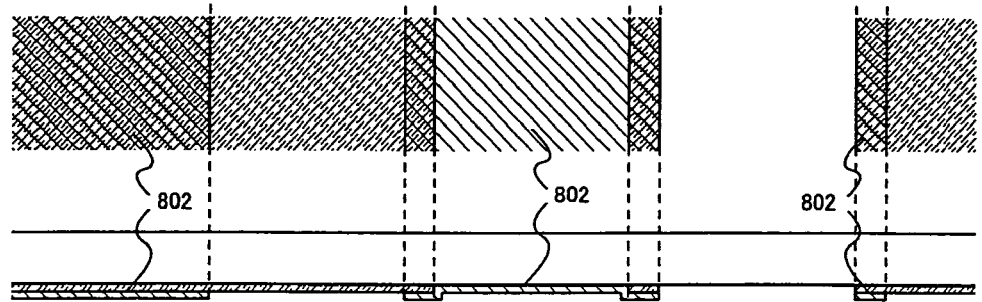
Figure 8C:
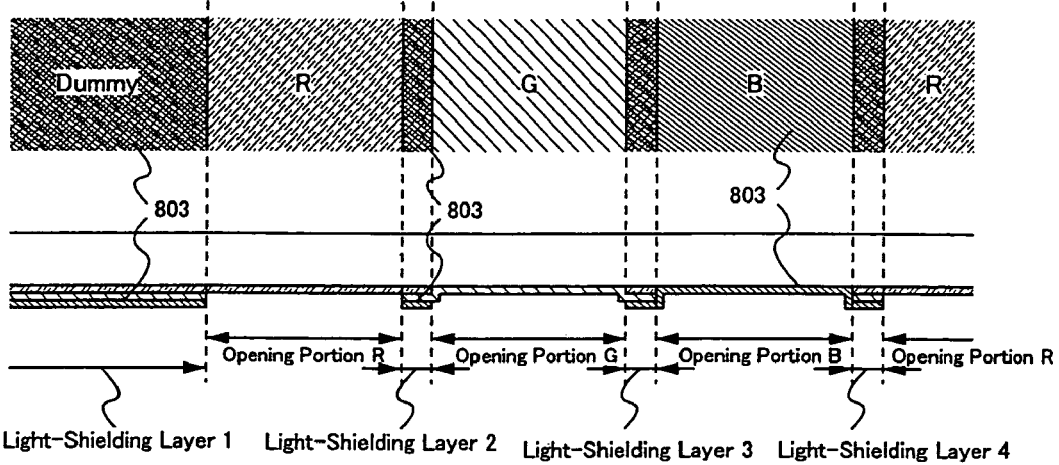

FIG. 8A to 8C schematically show that how coloring layers and light-shielding layers are formed on an opposing substrate in accordance with the present embodiment.

First, as an opposing substrate 800, barium borosilicate glass or aluminum borosilicate glass, represented by glass such as Corning #7059 glass or #1737 glass, is prepared. In addition, a translucent substrate such as a quartz substrate and a plastic substrate may also be used.

Next, an organic photosensitive material (CRY-S778: COLOR MOSAIC made by Fuji Film Olin Corp.) is applied to the opposing substrate 800, and patterned with photolithography as shown in FIG. 8A to form a first coloring layer (R) 801 at a predetermined position.

Next, a different organic photosensitive material (CGY-S705C: COLOR MOSAIC made by Fuji Film Olin Corp.) from the material for forming the first coloring layer (R) 801 is applied and patterned as shown in FIG. 8B with photolithography to form a second coloring layer (G) 802 at a predetermined position.

Next, a different organic photosensitive material (CVB-S706C: COLOR MOSAIC made by Fuji Film Olin Corp.) from the materials for the first coloring layer (R) 801 and the second coloring layer (G) 802 is applied and patterned as shown in FIG. 8C with photolithography to form a third coloring layer (G) 803 at a predetermined position.

As shown in FIG. 8C, a portion of the first coloring layer (R) 801 overlaps a portion of the second coloring layer (G) 802 and a portion of the third coloring layer (B) 803 at light-shielding layers 1 to 4. Here, the light-shielding layer 1 has a region for light shielding against light emitting portions of dummy pixels and current monitoring pixels, and light-shielding layers 2 to 4 are formed in order to suppress light leakage between adjacent pixels. In the first coloring layer (R) 801, a region that does not overlap any of the first to fourth light-shielding layers is to be an opening portion R. Similarly, in the second coloring layer (G) 802, a region that does not overlap any of the first to fourth light-shielding layers is to be an opening portion G, and in the third coloring layer (B) 803, a region that does not overlap any of the first to fourth light-shielding layers is to be an opening portion B.

Thus, when photolithography is performed three times, opening portions and light-shielding layers can be formed without additionally forming a light-shielding layer of a metal film or the like.

If necessary, a protective film (not shown) for covering the respective coloring layers is formed. Since a step is produced between a portion in which the coloring layer is of a single layer and a portion in which the plural coloring layers overlap, the protective film may be used as a planarization film. In this case, a film thickness of 2 μm to 3 μm is necessary. In the case of achieving an aim of preventing contamination due to impurities in the coloring layers, it is preferable to use a film with a high blocking property against contamination.

Although an organic photosensitive material is applied and patterned into a desired shape with photolithography to form the respective coloring layers 801 to 803 in the present embodiment, it is needless to say that the manufacturing method thereof is not particularly limited to the present embodiment.

In addition, an order of forming the coloring layers 801 to 803 is not limited to the present embodiment.

Embodiment 2

In the present embodiment, a description will be given on an example of manufacturing an active matrix EL display device with top-emission.

Figure 5A:
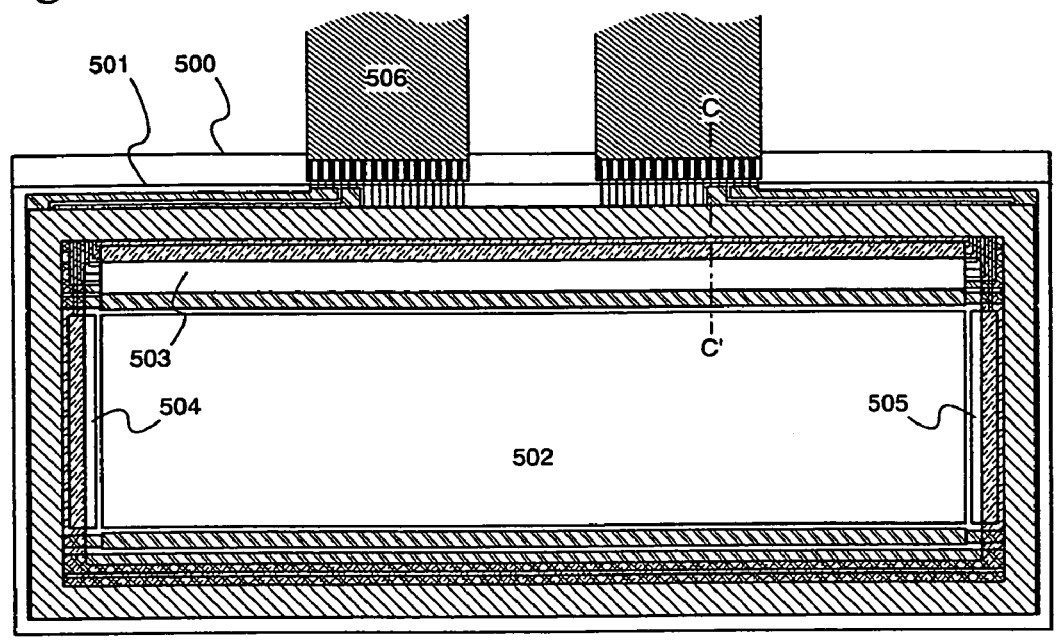
FIGS. 5A and 5B are diagrams showing an appearance and a section of an EL display device with top-emission.

FIG. 5A shows an appearance of an active matrix EL display device with top-emission manufactured with applying the present invention. A pixel portion 502 is provided at the center of a substrate 500, and a source signal line driving circuit 503, a first gate signal line driving circuit 504, and a second gate signal line driving circuit 505 are provided on the periphery of the pixel portion 502. It is from an external circuit via a flexible printed circuit (FPC) 506 that it is performed to power and input driving signals to the respective driving circuits.

Figure 5B:
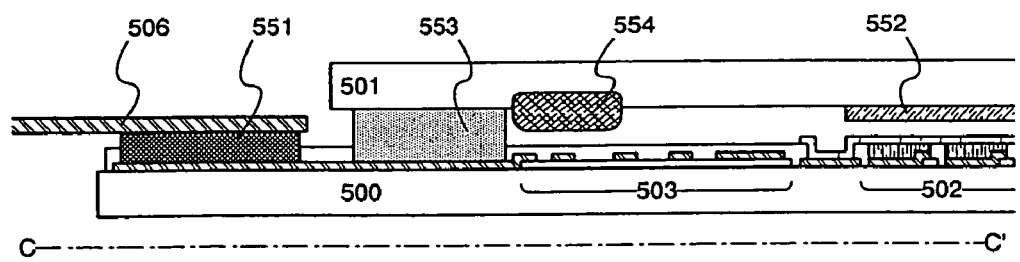

FIG. 5B shows a section along C-C' in FIG. 5A. As shown in FIG. 5B, the substrate 500 and an opposing substrate 501 are bonded and fixed along their circumferences with a sealing material 553, and an EL layer formed in the pixel portion 502 is kept airtight in order avoid exposure to air. In addition, the opposing substrate 501 has a groove formed along a region to which the sealing material is applied to provide a desiccant 554, which suppresses degradation of the EL layer due to moisture. Besides, the opposing substrate 501 has a coloring layer 552 formed in accordance with Embodiment Mode and Embodiment 1. As not shown in FIG. 5B, a protective film may be formed to cover a surface of the coloring layer in the case of concerning the EL layer and a TFT with contamination due to impurities in the coloring layer.

With respect to connection of the FPC 506 and the substrate 500, an anisotropic conductive paste 551 containing a conductive material inside is used for fixing, and the conductive material is electrically connected to a terminal for input and output of signals.

Embodiment 3

In the present embodiment, a description will be given on a manufacturing method of TFT to be formed on a substrate, particularly, of an n-channel TFT and a p-channel TFT to be formed in a driving circuit portion and an n-channel TFT and a p-channel TFT to be formed in a pixel portion.

First, a base insulating film is formed of a laminate of insulating films such as a silicon oxide film, a silicon nitride film, and a silicon oxynitride film (not shown in the figure). The base insulating film may employ any of a two-layer structure, a single-layer film of the above-mentioned insulating film and a structure of three or more layers laminated. As a first layer of the base insulating film, a silicon oxynitride film of deposition with plasma CVD using $SiH_4$, $NH_3$, $N_2O$, and $H_2$ as reaction gas is formed to have a thickness of 10 to 200 nm (preferably, 50 to 100 nm). Then, as a second layer of the base insulating film, a silicon oxynitride film of deposition with plasma CVD using $SiH_4$ and $N_2O$ as reaction gas is formed and laminated on the first layer to have a thickness of 50 to 200 nm (preferably, 100 to 150 nm).

Figure 9A:
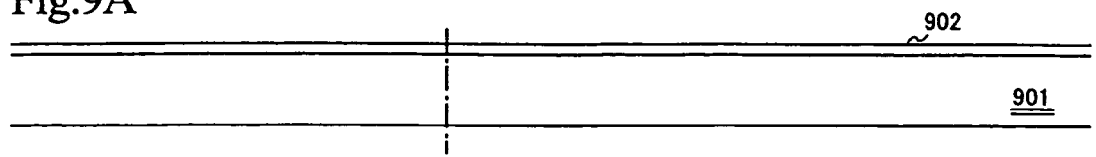
FIGS. 9A to 9E are diagrams showing processes for manufacturing an active matrix EL display device.

Next, as shown in FIG. 9A, a semiconductor film 902 is formed on the base insulating film. After a semiconductor film with an amorphous structure is deposited with a known means such as sputtering, LPCVD, or plasma CVD, treatment for crystallization (laser crystallization, thermal crystallization, thermal crystallization using a catalyst such as nickel, or the like) is performed. It is preferable to irradiate laser to promote crystallization after thermal crystallization using a catalyst such as nickel. Although a material for the semiconductor film is not limited, silicon or silicon-germanium alloy is preferable as the material for forming the semiconductor film.

In the case of manufacturing a crystalline semiconductor film with laser crystallizat)n, pulse-emission or continuous-emission laser such as excimer laser, YAG laser, and $YVO_4$ laser may be used. Then, in the case of using such laser, laser light emitted from a laser oscillator may be gathered into a linear shape with an optical system to be irradiated to a semiconductor film. Although conditions for crystallization are appropriately selected, a pulse oscillation frequency and a laser energy density are respectively set at 30 Hz and 100 to 400 mJ/cm$^2$ (typically, 200 to 300 mJ/cm$^2$) in the case of using excimer laser. In the case of using YAG laser, second harmonic thereof is used, and a pulse oscillation frequency and a laser energy density may be respectively set at 1 to 10 kHz and 300 to 600 mJ/cm$^2$ (typically, 350 to 500 mJ/cm$^2$). Laser light gathered into a linear shape with a width of 100 to 1000 μm, for example, 400 μm, may be irradiated to whole the substrate with the an overlap ratio of the linear laser light of 50 to 98%.

Figure 9B:
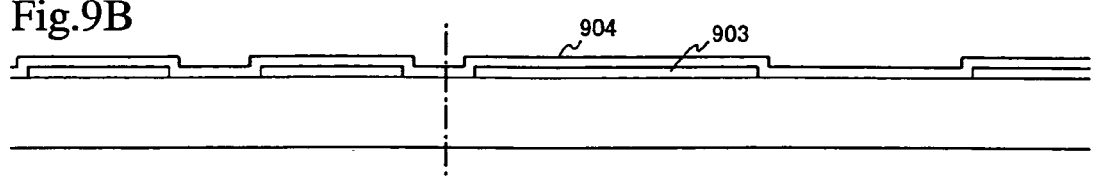

Then, boron is doped to the crystallized semiconductor film 902 (channel doping). After that, as shown in FIG. 9B, the semiconductor film 902 is patterned into a desired shape to form an island-shaped semiconductor film 903 to have a thickness of 25 to 80 nm (preferably, 30 to 60 nm). Next, a surface of the semiconductor film 903 is cleaned with an etchant including hydrofluoric acid, and a gate insulating film 904 is formed to cover the semiconductor film 903. With plasma CVD or sputtering, the gate insulating film 904 is formed of an insulating film including silicon to have a thickness of 40 to 150 nm. In the present embodiment, a silicon oxynitride film (composition ratio: Si=32%, O=59%, N=7%, and H=2%) is formed with plasma CVD to have 115 nm. Of course, the gate insulating film is not limited to the silicon oxynitride film, and a single layer or a laminated structure of other insulating film including silicon may be used.

Next, a first conductive film with a film thickness of 20 to 100 nm and a second conductive film with a film thickness of 100 to 400 nm are formed and laminated on the gate insulating film. In the present embodiment, a tantalum nitride film with a film thickness of 50 nm and a tungsten film with a film thickness of 370 nm are sequentially formed and laminated on the gate insulating film 904.

Each of the first and second conductive films may be formed of an element selected from Ta, W, Ti, Mo, Al, and Cu, or an alloy material or a compound containing the element as its main component, and a AgPdCu alloy or a semiconductor film represented by a poly-silicon film to which an impurity element such as phosphorus and the like is doped may be used as the first and second conductive films. In addition there is no limitation to the two-layer structure, for example, a tungsten film with a film thickness of 50 nm, an aluminum-silicon alloy (Al—Si) film with a film thickness of 500 nm, and a titanium nitride film with a film thickness of 30 nm may be sequentially laminated to be a three-layer structure. In the case of using the three-layer structure, a tungsten nitride film may be used instead of the tungsten film as the first conductive film, an aluminum-titanium alloy (Al—Ti) film may be used instead of the aluminum-silicon alloy (Al—Si) film as the second conductive film, and a titanium film may be used instead of the titanium nitride film as the third conductive film. Also, a single-layer structure may be employed.

After that, patterning is performed in accordance with procedures shown below to form respective gate electrodes and wirings. With ICP (Inductivity Coupled Plasma) etching, it is possible to perform etching of the first and second conductive films into a desirable tapered shape when etching conditions (such as electric power applied to a coiled electrode, electric power applied to an electrode at a substrate side, and a temperature of the electrode at the substrate side) are appropriately adjusted. As gas for etching, chlorine gas represented by gas such as $Cl_2$, $BCl_3$, $SiCl_4$, or $CCl_4$, fluorine gas represented by gas such as $CF_4$, $SF_6$, or $NF_3$, or $O_2$ may be appropriately used. In the present embodiment, first and second etching is performed after forming a mask of resist.

The first etching has first conditions of using $CF_4$, $Cl_2$, and $O_2$ as gas for etching, setting gas flow rate of the gas at 25/25/10 (sccm), applying RF (13.56 MHz) of 700 W to a coiled electrode under a pressure of 1 Pa and applying RF (13.56 MHz) of 150 W to a substrate side (a sample stage) to apply negative self-bias voltage actually. Under the first conditions, only the W film that is the second conductive film is subjected to etching to made into a tapered shape that has an end portion with an angle of 15 to 45°.

Figure 9C:
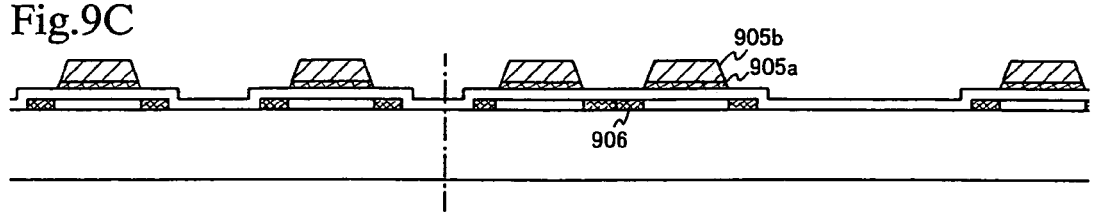
Figure 9D:
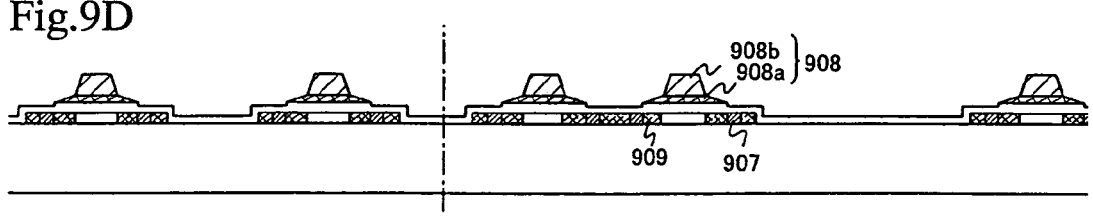

Then, the second etching is performed without removing the mask of resist, under second conditions of using $CF_4$, and $Cl_2$ as gas for etching, setting gas flow rate of the gas at 30/30 (sccm), applying RF (13.56 MHz) of 500 W to the coiled electrode under a pressure of 1 Pa and applying RF (13.56 MHz) of 20 W to the substrate side (the sample stage) to apply negative self-bias voltage actually. The TaN film that is the first conductive film and the W film that is the second conductive film are both subjected to etching at the same level under the second conditions to become a first conductive film 905a and a second conductive film 905b respectively as shown in FIG. 9C.

Next, first doping treatment is performed for doping an impurity element that gives a semiconductor film a conductivity type with self-aligning while the gate electrode is used as a mask is performed without removing the mask of resist. For the first doping ion treatment, doping or ion implantation may be employed. Phosphorus (P) or arsenic (As) is used as an impurity element for imparting n-type to form a first impurity region (n+ region) 906 as shown in FIG. 9C. In the first impurity region 906, the impurity element for imparting n-type is doped at a concentration of $1 \times 10^{20}$ to $1 \times 10^{21}/cm^3$.

Next, third etching is performed without removing the mask of resist, under third conditions of using $CF_4$, and $Cl_2$ as gas for etching, setting gas flow rate of the gas at 30/30 (sccm), applying RF (13.56 MHz) of 500 W to the coiled electrode under a pressure of 1 Pa and applying RF (13.56 MHz) of 20 W to the substrate side (the sample stage) to apply negative self-bias voltage actually.

After that, fourth etching is performed without removing the mask of resist, under fourth conditions of using $CF_4$, $Cl_2$, and $O_2$ as gas for etching, setting gas flow rate of the gas at 20/20/20 (sccm), applying RF (13.56 MHz) of 500 W to a coiled electrode under a pressure of 1 Pa and applying RF (13.56 MHz) of 20 W to a substrate side (a sample stage) to apply negative self-bias voltage actually. The third and fourth etching subjects the W film and the TaN film to anisotropic etching. Further, oxygen is included in the gas for etching to generate difference between etching rates to the W film and the TaN film and make the etching rates to the W film faster than the etching rate to the TaN film. The gate insulating film that is not covered with the first conductive film is subjected to etching to become thin. At this stage, there are formed a gate electrode 908 that has a first conductive layer (TaN film) 908a as a lower layer and a second conductive layer (W film) 908b as an upper layer, and an electrode (not shown in the figure).

Next, second doping treatment for doping an impurity element that gives a semiconductor film a conductivity type while the gate electrode is used as a mask is performed without removing the mask of resist. For the second doping treatment, ion doping or ion implantation may be employed. In the present embodiment, ion doping is used under conditions of using gas in which phosphine ($PH_3$) diluted to 5% with hydrogen and setting the gas flow rate at 30 sccm, a dose volume at $1.5 \times 10^{14}$ atoms/cm$^2$, and an acceleration voltage at 90 keV.

At this time, the mask of resist and the second conductive layer 908b function as masks, and a second impurity region (n$^-$ region) 907 that is not overlapped with the gate electrode and a third impurity region (n$^-$ region) 909 that is overlapped with a part of the gate electrode are formed with the second doping treatment. In the second impurity region 907, the impurity element for imparting n-type is doped at a concentration of $1 \times 10^{16}$ to $1 \times 10^{17}/cm^3$.

Figure 9E:
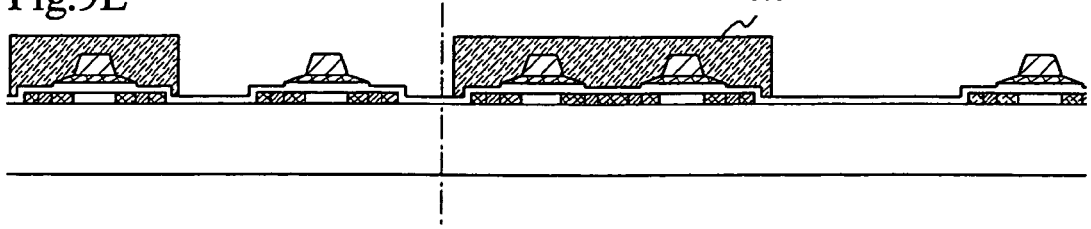

Next, after removing the mask of resist, a mask 910 of resist is newly formed to perform third doping treatment as shown in FIG. 9E. With the third doping treatment, fourth, fifth, and sixth impurity regions, to which an impurity element such as boron for imparting a conductivity type of p-type is doped, are formed in the semiconductor layer for forming a p-channel TFT. It is noted that what is necessary is obtaining a region that functions as a source region and a drain region and the fourth to sixth impurity regions are not indispensable.

The fourth impurity region is a region into which the impurity element for imparting p-type is to be doped at a concentration of $1 \times 10^{20}$ to $1 \times 10^{21}/cm^3$. Although the fourth impurity region is also a region (n$^+$ region) to which phosphorus (P) is doped in the previous process, the conductivity type thereof is p-type since the concentration of the doped impurity element for imparting p-type is one and half to three times as high as that of the doped phosphorus. Here, a region that has the same range of concentration as that of the fourth impurity region is also called p$^+$ region.

The fifth impurity region is a region formed in a region that is not overlapped with a tapered portion of the first conductive layer, and the impurity element for imparting p-type is doped at a concentration of $1 \times 10^{18}$ to $1 \times 10^{20}/cm^3$ therein. Although the fifth impurity region is also a region (n$^-$ region) to which phosphorus (P) is doped in the previous process, the conductivity type thereof is p-type since the concentration of the doped impurity element for imparting p-type is one and half to three times as high as that of the doped phosphorus. Here, a region that has the same range of concentration as that of the fifth impurity region is also called p$^-$ region.

The sixth impurity region is an impurity region that is overlapped with a tapered portion of the first conductive layer. Although the sixth impurity region is also a region (n$^-$ region) to which phosphorus (P) is doped in the previous process, the conductivity type thereof is p-type since the concentration of the doped impurity element for imparting p-type is one and half to three times as high as that of the doped phosphorus. Here, the sixth impurity region is also called p$^-$ region.

In accordance with the processes set forth above, the impurity regions that have a conductivity type of n-type or p-type are formed in the respective semiconductor layers.

After forming the impurity regions, heat treatment, irradiation of intense light, or irradiation of laser light is performed in order to activate the impurity elements. In addition to the activation, it is possible at the same time to recover plasma damage to the gate insulating film and an interface between the gate insulating film and the semiconductor layer. Particularly, excimer laser is used for irradiating from a side of a front surface or a rear surface in an atmosphere at a room temperature to 300° C. to activate the impurity elements. Besides, second harmonic of YAG laser may be irradiated for the activation. YAG laser is a preferable means for activation since little maintenance is necessary.

Next, a passivation film of an insulating film such as a silicon oxynitride film or a silicon oxide film is formed (not shown in the figure). After that, a clean oven is used for heating at 300 to 550° C. for 1 to 12 hours to perform hydrogenation of the semiconductor films. In the present embodiment, heating at 410° C. for 1 hour is performed in a nitrogen atmosphere. In this process, it is possible to terminate a dangling bond in the semiconductor film with hydrogen included in the passivation film In addition to the hydrogenation, the above activation of the impurity element can also be performed at the same time.

Figure 10A:
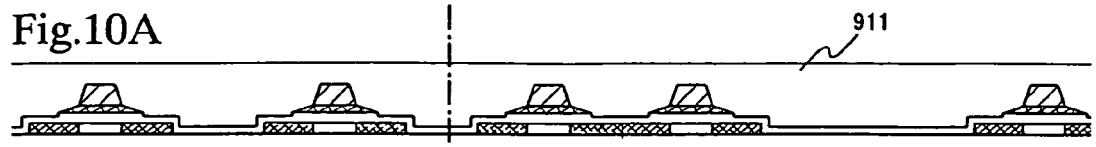
FIGS. 10A to 10D are diagrams processes for manufacturing the active matrix EL display device.

After that, an interlayer insulating film 911 of an inorganic material including silicon such as silicon oxide ($SiO_2$), silicon oxynitride (SiON), silicon oxynitride (SiNO), or silicon nitride (SiN) is formed on the passivation film as shown in FIG. 10A. If a surface of the interlayer insulating film has concavity and convexity formed at this time, it is more preferable to perform planarization since better coverage is obtained in the processes of forming a light emitting layer and an electrode and characteristics of an element is likely to become stable. For the planarization, etch back in which etching for planarization is performed after forming a coating film such as s resist film, chemical mechanical polishing (CMP), or the like may be employed. In the present embodiment, a silicon oxide film is formed with plasma CVD, and slurry appropriately selected from silica slurry, alumina ($Al_2O_3$) slurry with pH=3 to 4, or manganese oxide ($MnO_2$, $Mn_2O_3$) slurry is used to perform polishing with CMP for planarization.

Figure 10B:

Next, etching is performed sequentially to the passivation film, the interlayer insulating film 911, and the gate insulating film 904 to form an opening portion (contact). For the etching at this time, dry etching or wet etching may be employed. In the present embodiment, dry etching is employed to form the opening portion. Then, after forming the opening portion, a metal film is formed on the interlayer insulating film 911 and in the opening portion and etching of the metal film is performed to form source and drain electrodes 912, a source wiring, and a drain wiring as shown in FIG. 10B. As the metal film, a film of an element of aluminum (Al), titanium (Ti), molybdenum (Mo), tungsten (W), or silicon (Si), or an alloy film including these elements may be used. In the present embodiment, after laminating a titanium film/a titanium-aluminum alloy film/a titanium film (Ti/Al-Ti/Ti), the drain electrode, the source wiring, and the drain wiring are formed with patterning and etching performed for a desired shape.

After that, a material with a large work function is formed on a first electrode (a source electrode of a p-channel TFT in the pixel portion) to become an anode of a light emitting element to make injection of a hole easier in the light emitting element. As the material with the large work function, a translucent conductive material such as ITO (indium tin oxide) or IZO (indium zinc oxide), titanium nitride, zirconium nitride, or titanium carbide may be used. In addition, irradiation of ultraviolet light in an ozone atmosphere (Hereinafter, UV ozone treatment) may be performed to further increase the work function. In the present embodiment, an ITO film with a large work function is formed in contact with the source wiring formed of the laminate film of Ti/Al-Ti/Ti.

Figure 10C:
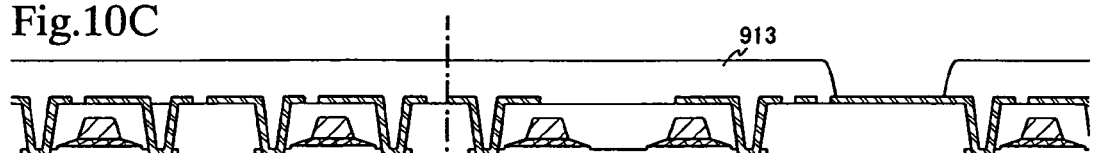

Next, an insulator (also called a bank, a partition, or a barrier) 913 for covering an end portion of the electrode 912 is formed as shown in FIG. 10C. For the insulator 913, photosensitive organic resin is used. For example, in the case of using negative photosensitive acrylic as a material of the insulator, the insulator 913 has a curved surface with a first curvature radius at the top portion and a curved surface with a second curvature radius at the bottom portion, and. it is preferable to make the first and second curvature radiuses 0.2 μm to 3 μm. In addition, the insulator 913 may be covered with a protective film of an aluminum nitride film, an aluminum oxynitride film, or a silicon nitride film. In the present embodiment, positive photosensitive acrylic is used as a material of the insulator 913, which is further covered with a protective film of an aluminum nitride film.

After that, a PVA (polyvinyl alcohol) porous body is used to wipe and remove a dust and the like. In the present embodiment, cleaning is performed with bellclean to remove fme powder (dusts) produced in etching of the ITO and the insulating film.

Next, baking of PEDOT applied entirely may be performed as treatment before evaporation of a light emitting layer. Since PEDOT dose not have a good wettability to ITO, it is preferable to perform washing with water after applying PEDOT once and to apply PEDOT again. After that, heating is performed in an atmosphere under reduced pressure. In the present embodiment, heating is performed in an atmosphere under reduced pressure at 170° C. for 30 minutes and natural cooling is performed for 30 minutes.

Figure 10D:
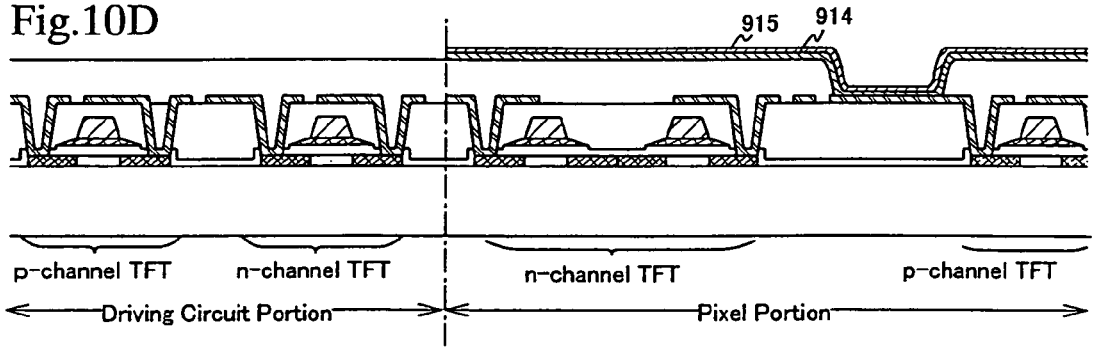

Next, an evaporation system is used to perform evaporation with an evaporation source in a deposition chamber subjected to vacuum evacuation to a degree of vacuum less than $5 \times 10^{-3}$ Torr (0.665 Pa), preferably, $10^{-4}$ to $10^{-6}$ Pa. In the evaporation, an organic compound is evaporated with resistance heating in advance, and flies in all directions when a shutter is opened at evaporation. The evaporated organic compound flies in an upward direction, and is evaporated to the substrate to form a light emitting layer (including a hole transporting layer, a hole injecting layer, an electron transporting layer, an electron injecting layer). The present embodiment has aromatic diamine (TPD) sealed in a first evaporation sources, p-EtTAZ sealed in a second evaporation source, $Alq_3$ sealed in a third evaporation source, a material sealed in a fourth evaporation source in which a red light emitting pigment of NileRed is added to $Alq_3$, and $Alq_3$ sealed in a fifth evaporation source, and deposition is performed with the materials sealed in the first to fifth evaporation sources to form a light emitting layer 914 on the entire substrate as shown in FIG. 10D.

Next, a second electrode 915 is formed as a cathode on the light emitting layer 914. A material that has a small work function and a translucency to emitted light may be used for the second electrode 915, and low resistance is also desired for the material. In the present embodiment, the second electrode 915 is formed of a laminate film of a thin film including a metal (Li, Mg, or Cs) with a small work function and a transparent conductive film (ITO: indium oxide-tin oxide alloy, $In_2O_3$-ZnO: indium oxide-zinc oxide alloy, or ZnO: zinc oxide) laminated thereon. Further, an auxiliary electrode may be formed on the insulator 913 in order to lower resistance of the cathode.

Although the light emitting layer 914 of low molecular weight materials with evaporation, there is no limitation. A light emitting layer of a polymer material may be formed with coating such as spin coating or inkjet. Further, a layer of a polymer material and a layer of a low molecular weight material may be laminated.

After the above processes till forming the second electrode 915, an opposing substrate that has a sealing material formed may be bonded as explained in Embodiment 2 in order to seal the light emitting element formed over the substrate 901.

Embodiment 4

A semiconductor device according to the present invention has versatile applications. In the present embodiment, a description will be given on example of electronic apparatuses to which the present invention is applicable.

As such electronic apparatuses, mobile information terminals such as an electronic notebook, a mobile computer, a mobile phone, a video camera, a digital camera, a personal computer, and a television are given. Some examples thereof are shown in FIGS. 11A to 11F.

Figure 11A:
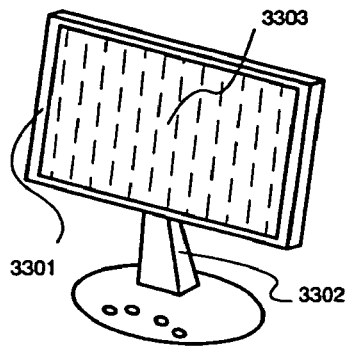
FIGS. 11A to 11F are diagrams showing examples of electronic apparatuses to which the present invention is applicable.

FIG. 11A illustrates an EL display device which includes a casing 3301, a support table 3302, a display portion 3303, and the like. A display device according to the present invention can be used for the display device 3303.

Figure 11B:
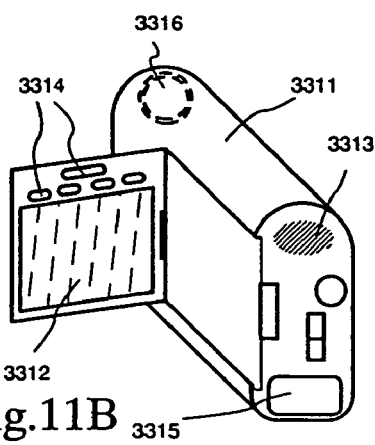

FIG. 11B illustrates a video camera which includes a main body 3311, a display portion 3312, a sound input portion 3313, an operation key 3314, a battery 3315, an image receiving portion 3316, and the like. A display device according to the present invention can be used for the display portion 3312.

Figure 11C:
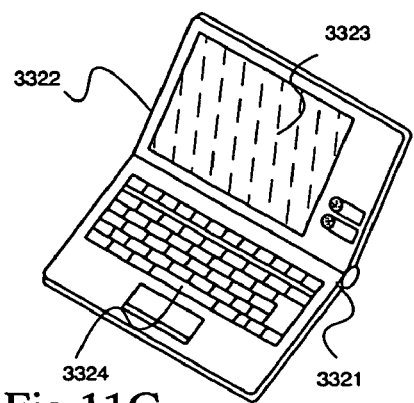

FIG. 11C illustrates a personal computer which includes a main body 3321, a casing 3322, a display portion 3323, a keyboard 3324, and the like. A display device according to the present invention can be used for the display portion 3323.

Figure 11D:
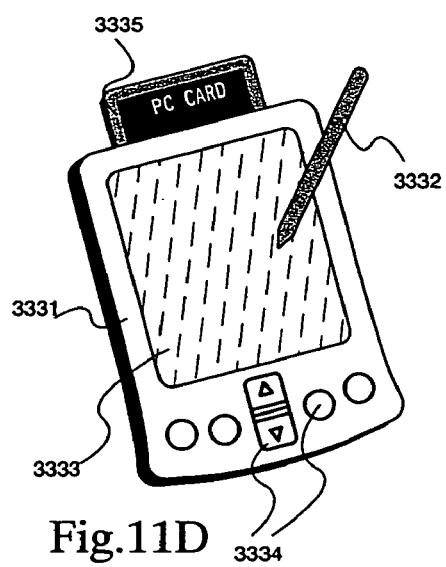

FIG. 11D illustrates a mobile information terminal which includes a main body 3331, a stylus pen 3332, a display portion 3333, an operation key 3334, an external interface 3335, and the like. A display device according to the present invention can be used for the display portion 3333.

Figure 11E:
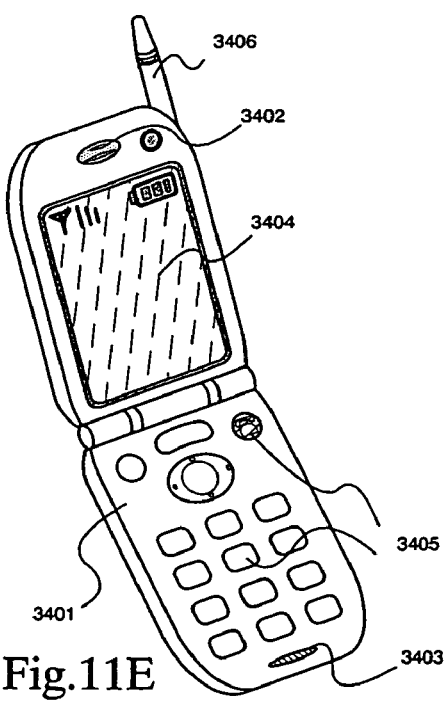

FIG. 11E illustrates a mobile telephone which includes a main body 3401, a sound output portion 3402, a sound input portion 3403, a display portion 3404, an operation key 3405, an antenna 3406, and the like. A display device according to the present invention can be used for the display portion 3404.

Figure 11F:
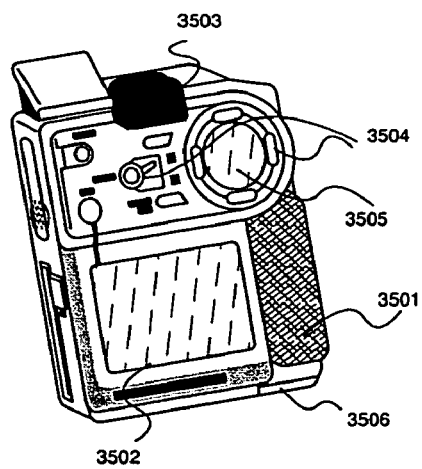

FIG. 11F illustrates a digital camera which includes a main body 3501, a display portion (A) 3502, a viewfinder 3503, an operation key 3504, a display portion (B) 3505, a battery 3506, and the like. A display device according to the present invention can be used for the display portion (A) 3502 and the display portion (B) 3505.

As set forth above, the present invention can be applied quite widely to electronic apparatuses in various fields. The electronic apparatuses in the present embodiment may employ any of configurations shown in Embodiments 1 to 3.

In accordance with the present invention, a laminate film of a plurality of different two or three coloring layers is used to form a light-shielding portion. As a result, a process for forming a light-shielding layer is reduced, which contributes to reduction of manufacturing cost and improvement of yield.

What is claimed is:

1. An electroluminescent display device comprising:
a first substrate;
a first light emitting element supported by the first substrate;
a second light emitting element supported by the first substrate;
a second substrate;
a first coloring layer for filtering emitted light from the first light emitting element, supported by the second substrate and overlapped with the first light emitting element; and
a second coloring layer for filtering emitted tight from the second light emitting element, supported by the second substrate and overlapped with the second light emitting element,
wherein the first substrate is opposite the second substrate, and
wherein a first portion between the first and second light emitting elements is overlapped with a second portion where the first coloring layer is overlapped with the second coloring layer.

2. An electroluminescent display device according to claim 1, wherein a light emitting portion of a dummy pixel is overlapped with the second portion.

3. An electroluminescent display device according to claim 1, wherein a current monitoring pixel is overlapped with the second portion.

4. An electroluminescent display device according to claim 1, wherein the first and second coloring layers are covered with a planarized protective film.

5. An electroluminescent display device according to claim 1, wherein the electroluminescent display device is a top-emission type.

6. An electroluminescent display device according to claim 1, wherein the electroluminescent display device is an active matrix type.

7. An electroluminescent display device comprising:
a first substrate;
a first light emitting element supported by the first substrate and including a first light emitting layer formed between a first electrode and a second electrode;
a second light emitting element supported by the first substrate and including a second light emitting layer formed between a third electrode and a forth electrode;
a second substrate;
a first coloring layer for filtering emitted light from the first light emitting element, supported by the second substrate and overlapped with the first light emitting element; and
a second coloring layer for filtering emitted light from the second light emitting element, supported by the second substrate and overlapped with the second light emitting element,
wherein the first substrate is opposite the second substrate, and
wherein a first portion between the first and second light emitting elements is overlapped with a second portion where the first coloring layer is overlapped with the second coloring layer.

8. An electroluminescent display device according to claim 7, wherein a light emitting portion of a dummy pixel is overlapped with the second portion.

9. An electroluminescent display device according to claim 7, wherein a current monitoring pixel is overlapped with the second portion.

10. An electroluminescent display device according to claim 7, wherein the first and second coloring layers are covered with a planarized protective film.

11. An electroluminescent display device according to claim 7, wherein each of end portions of the first and third electrodes is covered by an insulator overlapped with the first and second portions.

12. An electroluminescent display device according to claim 7, wherein the first and second light emitting layers are connected with each other.

13. An electroluminescent display device according to claim 7, wherein the second and fourth electrodes are connected with each other.

14. An electroluminescent display device according to claim 7, wherein the electroluminescent display device is a top-emission type.

15. An electroluminescent display device according to claim 7, wherein the electroluminescent display device is an active matrix type.

16. An electroluminescent display device comprising:
a first substrate;
a thin film transistor supported by the first substrate;
an insulating film formed over the thin film transistor and supported by the first substrate;
a first light emitting element formed over the insulating film and supported by the first substrate;
a second light emitting element formed over the insulating film and supported by the first substrate;
a second substrate;
a first coloring layer for filtering emitted light from the first light emitting element, supported by the second substrate and overlapped with the first light emitting element; and
a second coloring layer for filtering emitted light from the second light emitting element, supported by the second substrate and overlapped with the second light emitting element,
wherein the first substrate is opposite the second substrate, and
wherein a first portion between the first and second light emitting elements is overlapped with a second portion where the first coloring layer is overlapped with the second coloring layer.

17. An electroluminescent display device according to claim 16, wherein a light emitting portion of a dummy pixel is overlapped with the second portion.

18. An electroluminescent display device according to claim 16, wherein a current monitoring pixel is overlapped with the second portion.

19. An electroluminescent display device according to claim 16, wherein the first and second coloring layers are covered with a planarized protective film.

20. An electroluminescent display device according to claim 16, wherein the insulating film is planarized.

21. An electroluminescent display device according to claim 16, wherein the electroluminescent display device is a top-emission type.

22. An electroluminescent display device according to claim 16, wherein the electroluminescent display device is an active matrix type.

23. An electroluminescent display device comprising:
a first substrate;
a thin film transistor supported by the first substrate;
an insulating film formed over the thin film transistor and supported by the first substrate;
a first light emitting element formed over the insulating film, supported by the first substrate, and including a first light emitting layer formed between a first electrode and a second electrode;
a second light emitting element formed over the insulating film, supported by the first substrate, and including a second light emitting layer formed between a third electrode and a forth electrode;
a second substrate;
a first coloring layer for filtering emitted light from the first light emitting element, supported by the second substrate and overlapped with the first light emitting element; and
a second coloring layer for filtering emitted light from the second light emitting element, supported by the second substrate and overlapped with the second light emitting element,
wherein the first substrate is opposite the second substrate, and
wherein a first portion between the first and second light emitting elements is overlapped with a second portion where the first coloring layer is overlapped with the second coloring layer.

24. An electroluminescent display device according to claim 23, wherein a light emitting portion of a dummy pixel is overlapped with the second portion.

25. An electroluminescent display device according to claim 23, wherein a current monitoring pixel is overlapped with the second portion.

26. An electroluminescent display device according to claim 23, wherein the first and second coloring layers are covered with a planarized protective film.

27. An electroluminescent display device according to claim 23, wherein each of end portions of the first and third electrodes is covered by an insulator overlapped with overlapped with the first and second portions.

28. An electroluminescent display device according to claim 23, wherein the first and second light emitting layers are connected with each other.

29. An electroluminescent display device according to claim 23, wherein the second and fourth electrodes are connected with each other.

30. An electroluminescent display device according to claim 23, wherein the insulating film is planarized.

31. An electroluminescent display device according to claim 23, wherein the electroluminescent display device is a top-emission type.

32. An electroluminescent display device according to claim 23, wherein the electroluminescent display device is an active matrix type.

33. An electroluminescent display device comprising:
a first substrate;
a first pixel having a first light emitting element, supported by the first substrate;
a second pixel having a second light emitting element, supported by the first substrate;
a dummy pixel having a third light emitting element, supported by the first substrate;
a second substrate;
a first coloring layer for filtering emitted light from the first light emitting element, supported by the second substrate and overlapped with the first light emitting element; and
a second coloring layer for filtering emitted light from the second light emitting element, supported by the second substrate and overlapped with the second light emitting element, wherein the first substrate is opposite the second substrate, wherein a first portion between the first and second pixels is overlapped with a second portion where the first coloring layer is overlapped with the second coloring layer, and wherein the dummy pixel is overlapped with a third portion where the first and second coloring layer is overlapped with each other for shielding a light emitting portion of the dummy pixel.

34. An electroluminescent display device according to claim 33, wherein a current monitoring pixel is overlapped with the second portion.

35. An electroluminescent display device according to claim 33, wherein the first and second coloring layers are covered with a planarized protective film.

36. An electroluminescent display device according to claim 33, wherein each of the first, second, and dummy pixels has a thin film transistor.

37. An electroluminescent display device according to claim 33, wherein the electroluminescent display device is a top-emission type.

38. An electroluminescent display device according to claim 33, wherein the electroluminescent display device is an active matrix type.

* * * * *